(12) United States Patent
Simons et al.

(10) Patent No.: US 7,440,858 B2
(45) Date of Patent: Oct. 21, 2008

(54) POYNTING-VECTOR BASED METHOD FOR DETERMINING THE BEARING AND LOCATION OF ELECTROMAGNETIC SOURCES

(75) Inventors: David J. Simons, Modesto, CA (US);
Charles R. Carrigan, Tracy, CA (US);
Philip E. Harben, Livermore, CA (US);
Barry A. Kirkendall, Golden, CO (US);
Craig A. Schultz, Danville, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 11/404,609

(22) Filed: Apr. 13, 2006

(65) Prior Publication Data

US 2006/0235633 A1    Oct. 19, 2006

Related U.S. Application Data

(60) Provisional application No. 60/671,793, filed on Apr. 15, 2005.

(51) Int. Cl.
*G01R 13/00* (2006.01)
(52) U.S. Cl. ....................................................... 702/66
(58) Field of Classification Search ................... 702/66; 360/6; 385/12; 340/935
See application file for complete search history.

(56) References Cited

U.S. PATENT DOCUMENTS

| 3,778,761 | A | * | 12/1973 | Cribbins ..................... 340/935 |
| 3,986,207 | A | * | 10/1976 | Gerbel et al. .................. 360/6 |
| 5,136,597 | A |   | 8/1992  | Nightingale et al. |
| 5,315,308 | A | * | 5/1994  | Nehorai et al. .............. 342/448 |
| 5,680,489 | A | * | 10/1997 | Kersey ........................ 385/12 |

FOREIGN PATENT DOCUMENTS

| EP | 0 037 725 A | 10/1981 |
| EP | 0780690 A2  | 6/1997  |

OTHER PUBLICATIONS

Greenberg E, "Global Geolocation of intense Lightning Strokes Associated with TLEs Based on ELF Measurements from Single-Station" Electrical and Electronics Engineers in Israel, 2004. Proceedings. 2004 23rd IEEE Convention of Tel-Aviv, Israel Sep. 6-7, 2004, Sep. 6, 2004, pp. 25-28, Piscataway, NJ, USA, IEEE, US.

* cited by examiner

*Primary Examiner*—John E. Barlow
*Assistant Examiner*—Xiuquin Sun
(74) *Attorney, Agent, or Firm*—John P. Wooldridge; Michael C. Staggs; John H. Lee

(57) ABSTRACT

A method and apparatus is utilized to determine the bearing and/or location of sources, such as, alternating current (A.C.) generators and loads, power lines, transformers and/or radio-frequency (RF) transmitters, emitting electromagnetic-wave energy for which a Poynting-Vector can be defined. When both a source and field sensors (electric and magnetic) are static, a bearing to the electromagnetic source can be obtained. If a single set of electric (E) and magnetic (B) sensors are in motion, multiple measurements permit location of the source. The method can be extended to networks of sensors allowing determination of the location of both stationary and moving sources.

33 Claims, 2 Drawing Sheets

POYNTING-VECTOR BASED METHOD FOR DETERMINING THE BEARING AND LOCATION OF ELECTROMAGNETIC SOURCES

RELATED APPLICATION

This application claims priority from U.S. Provisional Patent Application No. 60/671,793, entitled "A POYNTING-VECTOR BASED METHOD FOR DETERMINING THE BEARING AND LOCATION OF ELECTROMAGNETIC SOURCES," filed on Apr. 15, 2005, and is incorporated by reference in its entirety.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the detection of radiating electromagnetic waves, and more particularly, the present invention relates to the detection and location of radiating sources, often low-frequency radiating electromagnetic sources operating within the near-field, using Poynting vector E and B field measurements.

2. Description of Related Art

Near-field radiation (NF) includes electric and magnetic fields that have a more static character (quasi-static) and are localized "near" the surface of objects, while far-field radiation (FF) also known as "normal radiation", generally refers to propagating radiation. In general, all radiating objects have both NF and FF components; however, most conventional detection methods of radiating sources generally avail themselves to propagative components in the FF. A source of radiation generally has three components: the tangential electric field, $E_t$, the radial electric field, $E_r$, and the tangential magnetic field, $H_t$. The Poynting Theorem itself generally states that for any superimposed electric and magnetic fields, there must be energy flowing in the medium. Thus, the accepted theory for radiating fields can be derived from an electric field E and a magnetic field H in a cross-product Poynting vector $E \times H = S$ (watts per meter squared).

All electric power systems that involve electricity generation, transmission and loads are subject to transmission loss. One form of loss that is virtually impossible to eliminate is the radiated field loss (NF & FF) that comes with changing loads or loads that respond to applied voltage in a nonlinear fashion in a power generation and utilization system. This is energy loss due to the non-ideal flow of electrical currents resulting in a radiated electromagnetic field that is highly dependent on the specifics of the generator and loads and the result of an imbalanced system. An isolated and remote power source such as a generator will always produce an electromagnetic field that can be detected at some stand-off range. The range, however, will be strongly dependent on the power utilization purpose and the specific layout of the generator and loads.

Accordingly, a need exists for novel methods and instrumentation to locate radiating sources, often low-frequency radiating sources within the near-field based on Poynting vector E and B field measurements. The present invention is directed to such a need.

SUMMARY OF THE INVENTION

Accordingly, the present invention is directed to a method of sensing one or more radiating electrical sources so as to produce one or more data formats characteristic of said sources; and calculating one or more Poynting vectors resulting from the data formats so as to produce a bearing, a distribution of harmonics, a spatial mapping of the sources and/or a temporal assessment.

Another aspect of the present invention provides a method of locating one or more radiating electrical sources that includes: sensing along three orthogonal axes to determine electric- and magnetic-field components, one or more broadband signals and quasi-static field signals; transforming to thereby convert the sensed signals to the frequency domain for each electric field axial component (E) and magnetic field axial component (B); filtering the transformed signals to enable selection of characteristic one or more predetermined harmonics of the one or more broadband signals; and calculating one or more Poynting vectors resulting from the filtered one or more predetermined harmonics generated at the same point in time so as to provide a bearing of one or more radiating sources.

Another aspect of the present invention provides an apparatus for detecting and locating one or more radiating electrical sources having electric (E) and magnetic (B) field components so as to provide a bearing, a spatial mapping and/or a temporal assessment of such sources.

A final aspect of the present invention provides a network of sensors for detecting and locating one or more radiating electrical sources having electric (E) and magnetic (B) field components so as to provide a bearing, a spatial mapping and/or a temporal assessment of such sources.

Accordingly, the present invention provides a method and apparatus suitable for the detection and source location of stationary radiating electric (E) and magnetic (B) fields emitted by, for example, A.C. generators, transmitters, electrical conductors and loads. Such techniques and devices, as disclosed herein, also enables spatial mapping of fields and remote source characterization and temporal assessment of electrical usage for stationary objects as well as for tracking movement of any radiating mobile source/load systems for which a cross-product Poynting vector may be determined as might be associated with, but not limited to cars, trucks, tanks, boats, submarines, airplanes, and space vehicles.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1A:
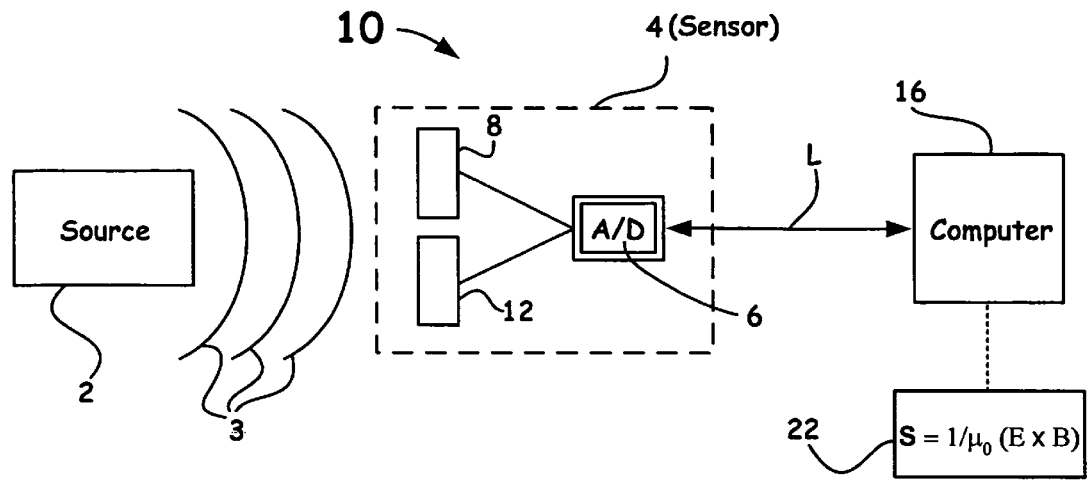
FIG. 1(a) shows a simplified diagram of a Poynting vector system in the field.

Referring now to the drawings, specific embodiments of the invention are shown. The detailed description of the specific embodiments, together with the general description of the invention, serves to explain the principles of the invention.

Unless otherwise indicated, numbers expressing quantities of ingredients, constituents, reaction conditions and so forth used in the specification and claims are to be understood as being modified by the term "about." Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical value, however, inherently contain certain errors necessarily resulting from the standard deviation found in their respective testing measurements.

General Description

The apparatus and methods, as disclosed herein, explores stand-off detection and location of radiating electrical sources, such as, a generator source powering realistic loads in the field, through Poynting vector E and B field measurements. Detection of signals by the present invention at common radiating source frequencies of, for example, 60 Hz (and higher harmonics) are well within the complex electromagnetic near-field region for stand-off ranges of less than about 1000 km. The present invention beneficially provides digitized (e.g., up to about 100,000 data points per second) time averaged detection and filtering of such E-field and B-field information to remove unwanted near-field quasi static fields (i.e. noise stream data) to enhance the signal-to-noise ratios of the desired received signals. The resultant high sensitivity three-axis E-field measurements, along with corresponding B-field measurements, as disclosed herein, enables calculation of a back-azimuth (i.e., a bearing with one or more measurements) as well as provide the distribution of electrical harmonics to a source. Such a method and corresponding system/apparatus thus enables determination of the location of a source within the near-field regime and source location capability at low frequency based on Poynting vector E and B field measurements.

Specific Description

Turning now to the drawings, a basic diagram that illustrates an exemplary basic embodiment of a system constructed in accordance with the present invention is shown in FIG. 1(a). Such a system, designated generally by the reference numeral 10, can be configured as a portable unit or extended to networks of sensors allowing determination of the bearing and location of both stationary and moving sources within a stand-off range of less than about 1000 meters.

System 10, can be directed by a user via a computer 16 having a control software program that can include a graphical user interface (GUI) configured from Visual Basic, MATLAB®, LabVIEW®, Visual C++, or any programmable language or specialized software programming environment to enable ease of operation when directing commands and acquiring desired information. LabVIEW® and/or MATLAB® in particular, is specifically tailored to the development of instrument control applications and facilitates rapid user interface creation and is particularly beneficial as an application to be utilized as a specialized software embodiment that can be automated when desired so as to provide a bearing and/or a spatial location of one or more radiating electrical sources/load systems, as well as provide the distribution of electrical harmonics, temporal assessment and/or spatial mapping of produced fields of one or more stationary or moving radiating sources.

Figure 1B:
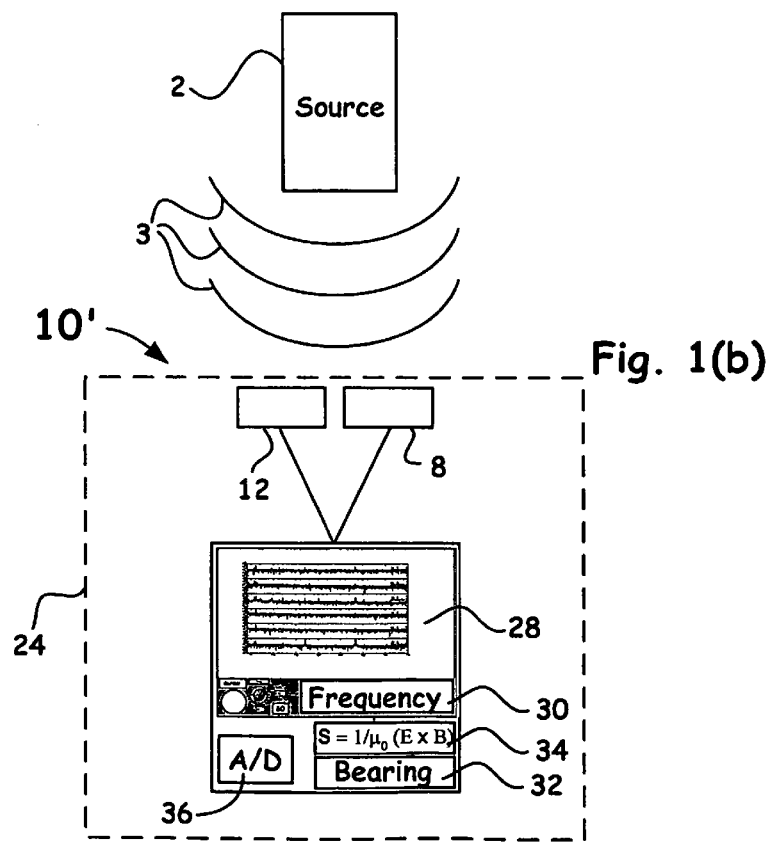
FIG. 1(b) shows an example hand held device of the present invention.

Computer 16 can be configured with analog to digital (A/D) integrated circuit capabilities as known by those of ordinary skill in the art and also constructed with means, such as, software, available firmware (ROM's, EPROM's) and integrated computational, storage, etc., circuit means, such as, but not limited to, large scale Integrated Circuits LSIC (LSIC), very large scale Integrated Circuits (VLSIC), and field-programmable gate arrays (FPGA's). Such software means, firmware means, and other integrated circuit means can provide the filtering, storage and computational manipulations that is desired for the present application. The FPGA array, in particular, is a beneficial semiconductor device to be utilized in the present invention as such devices contain programmable logic components and programmable interconnects. The programmable logic components can be programmed, for utilization in the present invention, such as, for example, in system 10 as shown in FIG. 1(a), or in remote hand-held applications, as shown in FIG. 1(b) and as discussed in detail below, to duplicate the functionality of basic logic gates (such as AND, OR, XOR, NOT) or more complex combinatorial functions such as decoders or simple math functions. In most FPGAs, these programmable logic components (or logic blocks, in FPGA parlance) also include memory elements, which may be simple flip-flops or more complete blocks of memories.

Computer 16, capable of being configured with such devices, is thus operably coupled to a sensor 4 (shown within a dashed box) or a network of such sensors (not shown), configured with triaxial B-field 8 and E-field 12 sensing units via wireless communication means and/or predetermined communication lines (denoted by the letter L and shown with double arrowed line) such as, USB or RS232 cables. Such wireless communication means and/or communication lines L are constructed and arranged to allow for the exchange of information between computer 16 and each sensor 4 outputting a stream of triaxial (i.e., X-Y-Z electrical (E) and magnetic (B)), A/D recorded data to effect operation of system 10 and to transfer acquired digitized information to computer 16 for storage, post-processing, and/or immediate analysis.

The B-field 8 and E-field 12 sensing units, as shown above in FIG. 1(a), thus senses desired radiation source signals and unwanted quasi-static (noise stream) signals and converts such sensed signals to a digital form using an electronic A/D converting circuit 6 means that can digitize up to about 100,000 bits per second of received information. The B-field 8 and E-field 12 sensing units can be specially designed units or commercially configured triaxial units, often configured with deployable antenna elements, an associated preamplifier to add gain to the output signals from the antennas. The B-field units, in particular, as utilized herein, often can include three orthogonal (i.e., perpendicular) metallic alloy cores with predetermined sets of windings designed to produce flux in the core and predetermined sets of windings to detect the flux. After B-field 8 and E-field 12 sensing units receives analog radiating signals 3 as shown in FIG. 1(a), at for example, 1 Hz or greater, such received signals are converted to a digital format by integrated circuit means well known by those of ordinary skill and the vector components of the recorded E and B fields (e.g., up to six channels corresponding to the three-axis measurements of the E and B fields) are each analyzed by a respective provided means (e.g., software, firmware, LSIC, VLSIC, FPGA's) residing in computer 16.

Thereafter, the Poynting vector S 22, as shown in FIG. 1(*a*), is determined, often by time averaging (e.g., of at least one period) such signals, to provide a stable Poynting vector S 22 signal in addition to removing the noise signals. Such a manipulation can thus provide a bearing and/or a spatial location of a radiating electrical source/load system(s), a temporal assessment of the electrical usage of such system(s), spatial mapping of produced fields, as well as the distribution of electrical harmonics.

As another beneficial arrangement, the sensor 4, as shown in FIG. 1(*a*), and designated generally by the reference numeral 10', can be configured as a hand-held sensor 24 (as shown within a dashed box in FIG. 1(*b*)), for ease of operation and movement in a variety of harsh or otherwise environments. Such a hand-held sensor 24 can include computational and operational specialized software means, often with a graphical user interface (GUI), as discussed above, configured from Visual Basic, MATLAB®, LabVIEW®, Visual C++, or any programmable language or specialized software programming environment to enable ease of operation when directing commands and acquiring desired information. The graphical user interface, in addition to a host of other configured operations, can be arranged to display a spectrum of triaxial frequencies 28, of one or more selected frequencies and/or harmonics 30 for filtering or monitoring so as to provide a resultant bearing 30 and/or a spatial location upon application of the Poynting vector calculations 34 by various integrated, software, or firmware means, as discussed above.

Moreover, in an additional arrangement, sensor 24, as shown in FIG. 1(*b*), may include commercial wireless interfaces (not shown), such as, but not limited to, infrared and/or microwave technologies, to enable communication and integration into a wireless network system (not shown) for triangulating a location of one or more predetermined sources or for downloading information to a central processor (not shown) for post processing and/or immediate analysis. The wireless technology itself may include any of the communication methods and hardware presently available, such as, but not limited to, ultra-wideband methods (UWB), International Electronic and Electrical Engineers (IEEE) protocols, or Bluetooth, a registered trademark of Bluetooth SIG, INC., Corporation by Assignment, Delaware, located in Washington D.C., or any of the new IEEE protocols for wireless communication over, as one example arrangement, a network system, such as an ad hoc system network (e.g., a system wherein one or more sensors relay messages through other sensor apparatus in order to communicate with, for example, a central processing unit or one or more other sensor apparatus that is out of range). Such example sensor arrangements can also provide a bearing and/or a spatial location of one or more radiating electrical sources/load systems as well as provide the spatial mapping of fields, and a distribution of electrical harmonics of radiating sources, as disclosed herein.

Similar to the arrangement, as shown in FIG. 1(*a*), sensor 24, as shown in FIG. 1(*b*), also includes an analog to digital (A/D) converter 36, capable of digitizing up to about 100,000 bits per second, for conversion to a digital format upon sensing alternating radiating fields from B-field 8 and E-field 12 sensing units. The E-field sensing units 12 and the B-field sensing units 8 can be the commercially configured triaxial units, as discussed above, for the system in FIG. 1(*a*). Also, as discussed above, sensor 24 can be configured with a preamplifier (not shown) to add gain to the output signals from the antennas and deployment mechanism drive electronics. After B-field 8 and E-field 12 sensing units receives analog radiating signals 3 at 1 Hz or greater, such received signals are converted to a digital format and the vector components of the recorded E and B fields (e.g., up to six channels corresponding to the three-axis measurements of the E and B fields) are each capable of being analyzed by a respective computational means, such as, firmware, software, LSIC, VLSI, and FGPA as discussed above, and displayed 28 by the graphical user interface capable of being configured in sensor 24. Thereafter, desired filtering of predetermined harmonics (e.g., 50 Hz and exceeding the $31^{st}$ harmonic of 50 Hz) can be time averaged by such computational means (e.g., averaged over at least one period) to remove the noise and analyzed to determine the Poynting vector S 34, as shown in FIG. 1(*b*), so as to provide, for example, a displayed bearing 32 of one or more electromagnetic radiating sources 2.

Figure 2:
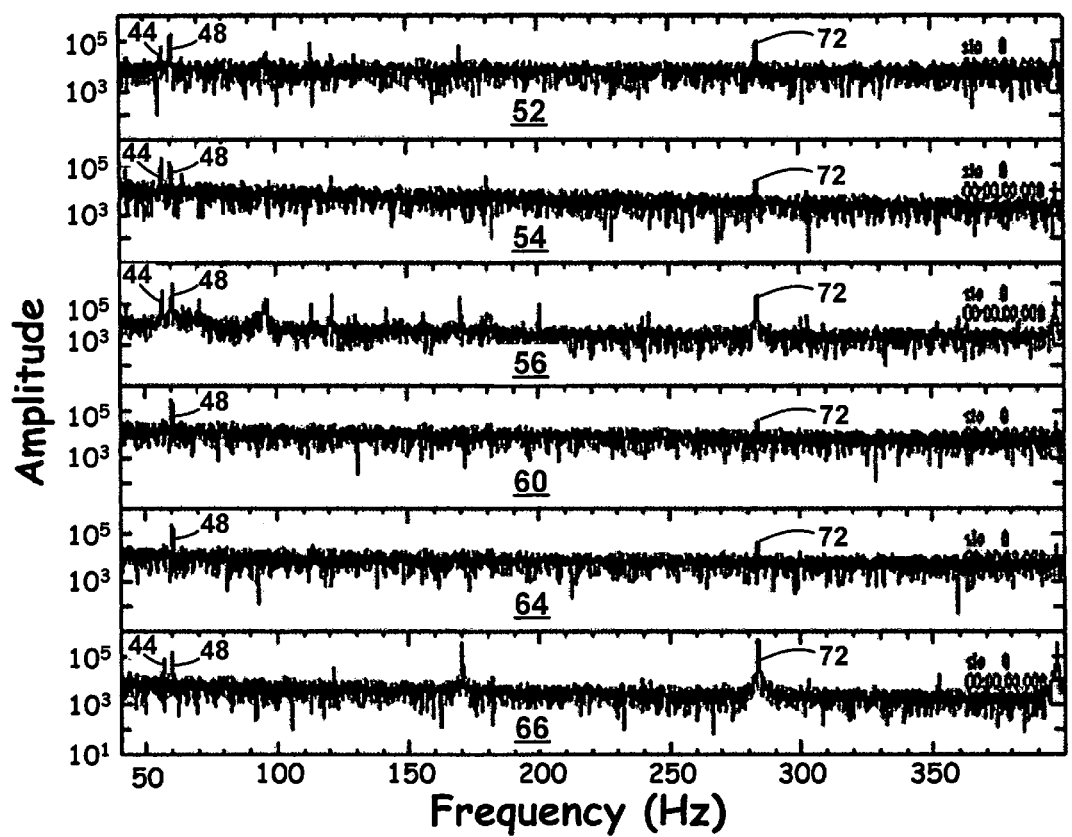
FIG. 2 shows experimental digitized frequency spectra of Electric (E) and Magnetic (B) field channels.

FIG. 2 shows experimental digitized Fast Fourier Transform (FFT) spectra of Electric (E) and Magnetic (B) field channels as generated by the present invention. To illustrate the capabilities of the present invention, example 56.7 Hz 40 and 60 Hz 44 peaks can be clearly observed in some of the spectra and are distinctly separated. The harmonics most apparent are associated with the generator, not harmonics of background 60 Hz. The spectra, top to bottom are the magnetic-field (B) triaxial components in the X-Y-Z plane, i.e., Bx 48, By 52, Bz 56, and the electric-field (E) triaxial components in the X-Y-Z plane, i.e., Ex 60, Ey 64, Ez 66. The fundamental and higher harmonics (e.g., see reference numeral 72, which is the fifth harmonic of 56.7 Hz) can vary greatly in signal-to-noise between E and B field components.

In the method of the invention, the first stage involves signal sensing and converting the analog signal from the E- and B-field sensors to a digital format. Six channels are recorded corresponding to the three-axis measurements of both the electric and magnetic fields. The vector components of the E and B fields are necessary for determination of the Poynting vector, S.

The second stage involves analyzing the broadband digital data stream resulting from the first acquisition and analog-to digital conversion stage. From the second stage, two methods of analysis can be used to calculate required E- and B-field components from the signal and noise data stream.

The first method requires calculating the transform, often calculating the Fast Fourier Transform (FFT), of the broadband signal and noise data stream. The FFT gives the spectrum of signal and noise amplitude versus frequency. Using the FFT, harmonics of a signal of interest (e.g., 56.7 Hz 40 and higher harmonics (72), as shown in FIG. 2, and exceeding the $31^{st}$ harmonic) can be selected, wherein information from each harmonic common to the E and B vector fields can be beneficially utilized to determine a Poynting vector. The calculation of such Poynting vectors can be used to increase the certainty of source location. In addition, the Poynting vector of each harmonic can be used as a characteristic to identify a set of harmonics associated with a common source. Narrow bandpass filters (e.g., Butterworth, Bessel, Chebyshev, combinations thereof or similar) can be constructed to filter the broadband signal and a quasi-static field (noise data stream) for the selected harmonics. Such filtering of the broadband signal and noise data stream of each component of B and E produces a digital wave train having a frequency characteristic of each harmonic. This is performed for the data stream associated with each B and E component (e.g., 52, 56, 60, 64, and 66, as shown in FIG. 2).

Samples of the wave train amplitude corresponding to the same point in time are then taken from each of the six wave trains. These six amplitudes correspond to the instantaneous value of the E and B fields associated with a given harmonic and are used to calculate an instantaneous value of the Poynting vector, S. Because the Poynting vector is time dependent, averaging over at least one period is performed to obtain a stable quantity S.

B. The second analysis method takes the digitized broadband signal and noise stream, as discussed above, and calculates, for example, the FFT giving both phase and amplitude information. The amplitudes of selected harmonics along with phase information can be obtained from the FFT for each of the three components of E and B, as shown in FIG. 2. This information can then be used to calculate an instantaneous value of the Poynting vector that can be averaged over time to yield the Poynting vector S. The time average of the oscillatory Poynting vector yields directional information such as the azimuthal angle between a reference direction and the direction of energy flux associated with a remote source.

The present invention can thus locate (i.e., provide a bearing and/or a spatial location of a radiating electrical source/ load system) as well as provide the distribution of electrical harmonics of one or more radiating sources of 50 Hz or greater, such as, but not limited to, stationary radiating electric (E) and magnetic (B) fields sources (e.g., A.C. generators, transmitters, electrical conductors and loads), in addition to spatially mapping fields and remote source characterization and temporal assessment of electrical usage produced by stationary objects of up to about 1000 meters. Moreover, the present invention is configured to track the movement of any radiating mobile source/load systems for which a Poynting vector may be determined as might be associated with, but not limited to cars, trucks, tanks, boats, submarines, airplanes, and space vehicles.

Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The invention claimed is:

1. A method, comprising:
    sensing one or more radiating electrical sources and producing one or more data formats characteristic of said sources, wherein said data formats comprise a distribution of harmonics that includes frequencies of greater than about 1 Hz;
    producing one or more Poynting vectors resulting from said data formats to enable the determination of at least one of a (i) location and bearing, (ii) a spatial mapping of fields, and (iii) a temporal assessment of said one or more radiating electrical sources; and
    time-averaging said one or more Poynting vectors to obtain a stable quantity of said Poynting vectors in addition to removing one or more quasi-static field signals and noise.

2. The method of claim 1, wherein said data formats comprise electric-field (E) and magnetic-field triaxial data.

3. The method of claim 1, wherein said distribution of harmonics comprises at least up to the $31^{st}$ harmonic.

4. The method of claim 1, wherein said one or more radiating electrical sources comprise a broadband emission and a quasi-static field.

5. The method of claim 1, wherein the step of time-averaging comprises weighted time averaging over at least one period.

6. The method of claim 1, wherein the step of producing one or more Poynting vectors further comprises providing a phase and/or a wave train amplitude data set for each sensed one or more radiating electrical sources having electric (E) and magnetic (B) axial components.

7. A method of locating one or more radiating electrical sources, comprising:
    sensing along three orthogonal axes to determine electric- and magnetic-field components, one or more broadband signals and one or more quasi-static field signals;
    transforming to the frequency domain, each electric-field axial component (E) and magnetic-field axial component (B) comprised in said signals;
    filtering said transformed signals to enable selection of characteristic one or more predetermined harmonics of said one or more broadband signals;
    calculating one more Poynting vectors resulting from said filtered one or more predetermined harmonics generated at the same point in time so as to remove said quasi-static field; and
    displaying a bearing and location, a spatial mapping of fields, and/or a temporal assessment of said one or more radiating electrical sources as a result of said calculated one or more Poynting vectors.

8. The method of claim 7, further comprising time-averaging to obtain a stable quantity of said Poynting vectors in addition to removing said one or morn quasi-static field signals and noise.

9. The method of claim 8, where in said time-averaging comprises weighted time averaging over at least one period.

10. The method of claim 7, where in said transforming step comprises a Fourier Transform.

11. The method of claim 10, wherein said Fourier Transform comprises a Fast Fourier Transform.

12. The method of claim 7, wherein said transforming step further comprises providing a phase and/or a wave train amplitude data set for each electric field axial component (E) and each magnetic field axial component (B) contained in said signals.

13. The method of claim 7, wherein said one or more predetermined harmonics comprises a distribution of harmonics that further comprises frequencies of greater than about 1 Hz.

14. The method of claim 7, wherein said distribution of harmonics comprises up to about the $31^{st}$ harmonic.

15. The method of claim 7, further comprising sensing said one or more broadband signals and one or more noise quasi-static field signals while moving to provide a bearing of one or more radiating sources.

16. The method of claim 7, wherein said one or more radiating sources comprise one or more moving radiating sources and/or one or more stationary radiating sources.

17. A sensor apparatus for locating one or more radiating electrical sources, comprising:
    an electric-field (E) and magnetic-field triaxial antenna configured to sense one or more broadband and one or more quasi static fields signals;
    means for converting to the frequency domain, each electric field axial component (E) and magnetic field axial component (B) comprised in said signals;
    means for filtering said converting signals to enable selection of characteristic one or more predetermined harmonics of said one or more broadband sensed fields; and
    means for providing one or more Poynting vectors resulting from said filtered one or more predetermined harmonics, wherein said means for providing enables a bearing, a spatial mapping and/or a temporal assessment of one or more radiating electrical sources.

18. The apparatus of claim 17, wherein said one or more predetermined harmonics comprises a distribution of harmonics that further comprises frequencies of greater than about 1 Hz.

19. The apparatus of claim 18, wherein said distribution of harmonics comprises up to about the 31$^{st}$ harmonic.

20. The apparatus of claim 17, wherein said means for providing comprises time-averaging.

21. The apparatus of claim 20, wherein said time-averaging comprises weighted time averaging over at least one period so as to provide one or more stable Poynting vectors and to remove said quasi-static fields and noise.

22. The apparatus of claim 17, wherein said means for converting to the frequency domain comprises a Fast Fourier Transform.

23. The apparatus of claim 22, wherein said means for converting to the frequency domain further comprises providing a phase and/or a wave train amplitude data set for each electric field axial component (E) and each magnetic field axial component (B) contained in said signals.

24. The apparatus of claim 17, wherein said one or more radiating sources comprise one or more moving radiating sources and/or one or more stationary radiating sources.

25. A network for locating one or more radiating electrical sources, comprising:
   a plurality of sensors, wherein each of said sensors further comprise:
   an electric-field (E) and magnetic-field triaxial antenna configured to sense one or more broadband and one or more quasi-static field signals;
   means for converting to the frequency domain, each electric field axial component (E) and magnetic field axial component (B) comprised in said signals;
   means for filtering said converting signals to enable selection of characteristic one or more predetermined harmonics of said one or more broadband sensed fields; and
   means for providing one or more Poynting vectors resulting from said filtered one or more predetermined harmonics, wherein said means for providing enables a bearing, a spatial mapping and/or a temporal assessment of one or more radiating electrical sources.

26. The network of claim 25, wherein said one or more filtered predetermined harmonics comprises a distribution of harmonics that further comprises frequencies of greater than about 1 Hz.

27. The network of claim 26, wherein said distribution of harmonics comprises up to about the 31$^{st}$ harmonic.

28. The network of claim 27, wherein said means for providing comprises time-averaging.

29. The network of claim 28, wherein said time-averaging comprises weighted time averaging over at least one period so as to remove said quasi-static fields and noise.

30. The network of claim 25, wherein said network comprises an ad-hoc configuration.

31. The network of claim 25, wherein said network comprises wireless communication.

32. The network of claim 25, wherein said one or more radiating sources comprise one or more moving radiating sources and/or one or more stationary radiating sources.

33. The network of claim 32, wherein said one or more moving radiating sources and/or one or more stationary radiating sources comprises at least one source selected from: A.C. generators, transmitters, electrical conductors, electrical loads, cars, trucks, tanks, boats, submarines, airplanes, and space vehicles.

* * * * *